United States Patent
Shinonaga

(10) Patent No.: US 7,839,953 B2
(45) Date of Patent: Nov. 23, 2010

(54) TRANSMISSION SIGNAL GENERATING UNIT AND RADAR TRANSMISSION DEVICE USING THE SAME

(75) Inventor: Mitsuyoshi Shinonaga, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 796 days.

(21) Appl. No.: 11/751,979

(22) Filed: May 22, 2007

(65) Prior Publication Data

US 2007/0273577 A1 Nov. 29, 2007

(30) Foreign Application Priority Data

May 25, 2006 (JP) .......................... P2006-145733

(51) Int. Cl.
*H04L 27/04* (2006.01)
(52) U.S. Cl. ...................................... 375/300
(58) Field of Classification Search ................ 375/239, 375/295, 300
See application file for complete search history.

(56) References Cited

U.S. PATENT DOCUMENTS

| 4,101,853 | A |   | 7/1978 | Kosugi |
| 4,438,413 | A | * | 3/1984 | Ryan ........................ 332/100 |
| 4,580,139 | A | * | 4/1986 | Weathers et al. ............ 342/189 |
| 5,140,332 | A |   | 8/1992 | Martin et al. |
| 7,151,484 | B2 |  | 12/2006 | Shinonaga et al. |
| 2006/0200035 | A1 | * | 9/2006 | Ricci et al. .................. 600/513 |

FOREIGN PATENT DOCUMENTS

| EP | 0 250 048 | 12/1987 |
| GB | 2 334 392 A | 8/1999 |
| JP | 4-357485 | 12/1992 |
| JP | 2002-181921 | 6/2002 |
| JP | 2005-128011 | 5/2005 |
| JP | 2005-257435 | 9/2005 |
| JP | 3785542 | 3/2006 |
| JP | 2006-284241 | 10/2006 |
| WO | WO 94/01933 | 1/1994 |
| WO | WO 2004/077775 A1 | 9/2004 |

OTHER PUBLICATIONS

U.S. Appl. No. 11/476,864, filed Jun. 29, 2006, Mitsuyoshi Shinonaga.
Mitsuyoshi Shinonaga, et al., "New Direct Calculation Method for Maximum S/N Correlation Filter Coefficients Constrained to Zero Output Values", The IEICE Transactions on Communications, vol. J89-B, No. 10, 2006, pp. 1921-1930 and 1 cover page (with English Abstract).
John L. Stensby, "Phase-Locked Loops: Theory and Applications", CRC Press, XP-002462471, 1997, pp. 7 and 8.
Fred E. Nathanson, "Pulse Doppler and Burst Waveforms", SCITECH Publishing, XP-002462472, 1999, pp. 469-531.

* cited by examiner

*Primary Examiner*—Don N Vo
(74) *Attorney, Agent, or Firm*—Oblon, Spivak, McClelland, Maier & Neustadt, L.L.P.

(57) ABSTRACT

A transmission signal generating unit has a window function calculator that generates a window function that makes all frequencies without a center frequency of an input signal and its adjacent frequencies zero and makes the signal to noise ratio of the center frequency maximum; and a transmission signal generator that generates a transmission signal whose amplitude is modulated in a shape of an envelope curve based on the window function generated by the window function calculator.

7 Claims, 2 Drawing Sheets

ALL DATA (CORRESPONDING TO AN APERTURE TIME)

TRANSMISSION SIGNAL GENERATING UNIT AND RADAR TRANSMISSION DEVICE USING THE SAME

BACKGROUND OF THE INVENTION

1. Field of the Invention

The present invention relates to a transmission signal generating unit and a radar transmission device using the same.

2. Description of Related Art

Since the utilization of radio waves is increasing, narrowing the frequency band of a radar signal is strongly demanded to efficiently use frequencies between various devices.

In addition, suppressing the spurious components of the radar signal as low as possible has become an international issue. The development of technology to narrow the frequency band and to suppress the spurious components enables to operate the radars within a narrower frequency band. This will contribute to solve the shortage of frequencies.

As a solution for these problems, a low-power pulse compression radar is put to practical use.

Japanese Patent Publication Laid-open No. H4-357485 shows a radar signal processing device employing a pulse compression method. This radar signal processing device transmits a chirp signal (liner FM modulated signal) as a transmission signal to a relatively moving target, receives a signal reflected by the moving target as a received signal, then extracts Doppler components due to the movement of the target from the received signal, and detects the moving target based on the Doppler components.

In this pulse compression method, a modulated long pulse is transmitted and after the reception a short pulse is obtained with its signal to noise ratio (SNR) improved by a pulse compression filter suitable for the modulated long pulse. This method has many advantages such as the extension of detection range, the achievement of high range-resolution ability, and the reduction of interference signals. Thus, the method is applied to many radars.

SUMMARY OF THE INVENTION

In the above pulse compression type radar, a chirp signal or a phase code modulated signal is used as a transmission signal. These signals have low side-lobes after pulse compression, but their spectrum widths are wide and many spurious components are included.

In order to suppress the spurious components, a tapering is applied to edge parts of the waveform of a transmission signal, however, the more the spurious components are suppressed, the lower the level of the signal becomes.

Although the above trade-off relationship cannot be solved completely, it seems to be possible to show the limit of narrowing the frequency band of a transmission signal while maintaining the signal level for a spurious level to be low. However, there is no conventional method that shows the limit and therefore the feasible limit of the performance has been unknown.

An object of the present invention is to provide a transmission signal generating unit and a radar transmission device using the same which enable to suppress spurious components of a transmission signal and achieve the maximum signal level of a center frequency of the transmission signal.

To achieve the above described object, the transmission signal generating unit of the present invention comprises a window function calculator that generates a window function that makes all frequencies without a center frequency of an input signal and its adjacent frequencies zero and makes a signal to noise ratio of the center frequency maximum; and a transmission signal generator that generates a transmission signal whose amplitude is modulated based on the window function generated by the window function calculator.

DETAILED DESCRIPTION OF THE PREFERRED EMBODIMENT

There will be below explained a transmission signal generating unit according to an embodiment of the present invention in detail with reference to several figures.

Figure 1:
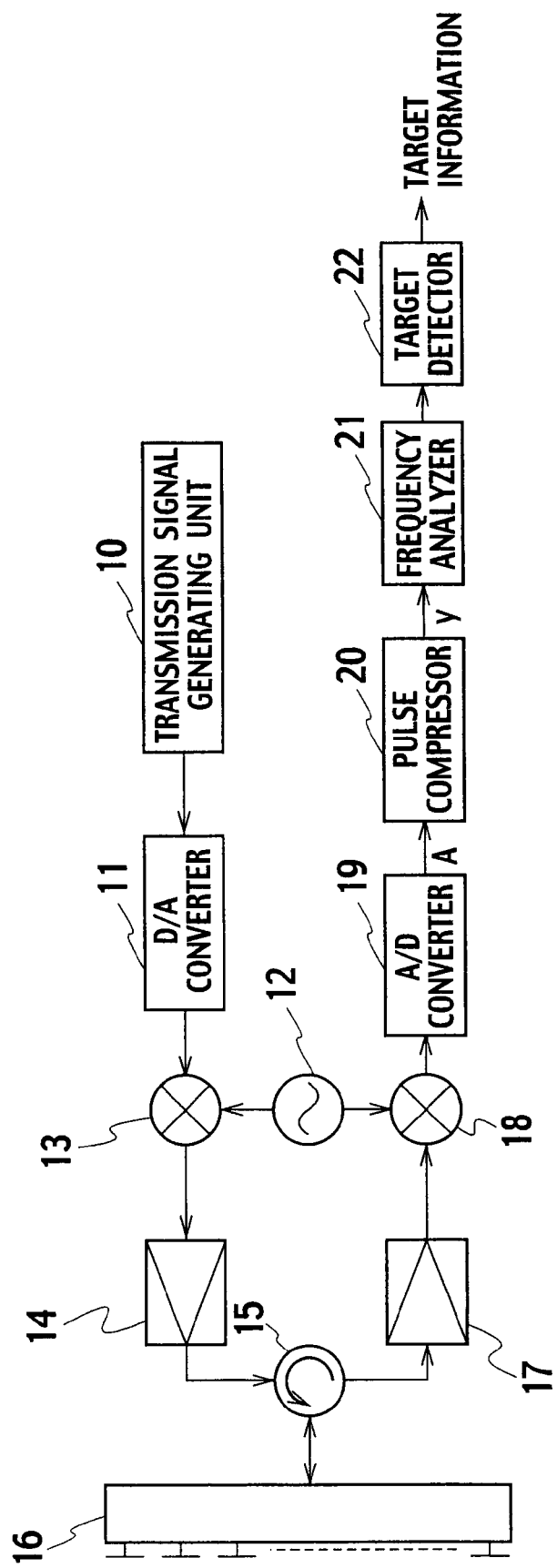
FIG. 1 shows the schema of a radar device employing a transmission signal generating unit according to an embodiment of the present invention.

FIG. 1 shows the schema of a radar device employing the transmission signal generating unit according to the embodiment of the present invention.

The radar device comprises a transmission signal generating unit 10, a D/A converter 11, a local oscillator 12, a transmitting side mixer 13, a transmission signal amplifier 14, a circulator 15, an antenna 16, a received signal amplifier 17, a receiving side mixer 18, an A/D converter 19, a pulse compressor 20, a frequency analyzer 21, and a target detector 22.

The transmission signal generating unit 10 generates a digital signal (pulse signal) as a transmission signal and transmits it to the D/A converter 11. The D/A converter 11 converts the transmission signal transmitted by the transmission signal generating unit 10 to an analog signal and transmits it to the transmitting side mixer 13. The local oscillator 12 generates a local signal having a local frequency and transmits it to the transmitting side mixer 13 and the receiving side mixer 18. The transmitting side mixer 13 mixes the transmission signal transmitted by the D/A converter 11 and the local signal transmitted by the local oscillator 12 to obtain a radio frequency signal and transmits it to the transmission signal amplifier 14.

The transmission signal amplifier 14 amplifies the radio frequency signal transmitted by the transmitting side mixer 13 to a predetermined signal level and transmits it to the circulator 15. The circulator 15 switches between the first operation that outputs the radio frequency signal transmitted by the transmission signal amplifier 14 to the antenna 16 and the second operation that outputs a received signal received by the antenna 16 to the received signal amplifier 17.

The antenna 16, such as an array antenna, transmits the radio frequency signal, transmitted by the transmission signal amplifier 14 through the circulator 15, toward a target. Also, the antenna 16 receives a reflected wave from the target and then transmits it to the circulator 15 as a received signal.

The received signal amplifier 17 amplifies the received signal, received from the antenna 16 through the circulator 15, with a low noise and transmits it to the receiving side mixer 18. The receiving side mixer 18 converts the received signal received from the received signal amplifier 17 to an intermediate frequency signal (IF signal) by mixing the received signal and the local signal received from the local oscillator 12 and transmits it to the A/D converter 19. The A/D converter 19 converts the IF signal transmitted by the receiving side mixer 18 to a digital signal and transmits it to the pulse compressor 20.

The frequency analyzer 21 performs Fourier transformation on a signal compressed by the pulse compressor 20 to transform data from time-domain to frequency-domain. Then, the received signal is decomposed to detect the relative speed of the target. The target detector 22 extracts Doppler components from the decomposed components, which represent the speed components of the target, to detect the target.

Next, there is explained the detail of the transmission signal generating unit 10 according to the embodiment of the present invention.

Figure 2:
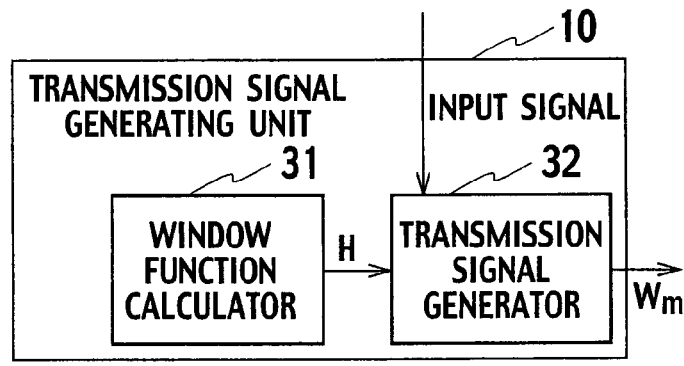
FIG. 2 shows the structure of the transmission signal generating unit according to the above embodiment.

FIG. 2 shows the structure of the transmission signal generating unit 10 in detail. The transmission signal generating unit 10 comprises a window function calculator 31 and a transmission signal generator 32.

The window function calculator 31 generates a window function H that makes all frequencies without a center frequency of an input signal (phase-modulated rectangular pulse) and its adjacent frequencies zero and that makes the SNR of the center frequency maximum, and transmits the generated window function H to the transmission signal generator 32. The detail of the window function calculator 31 will be explained later.

The transmission signal generator 32 generates a transmission signal by modulating the amplitude of the input signal using the window function H transmitted by the window function calculator 31.

However, there is explained a transmission signal generating method, in particular, how to calculate the window function H in the window function calculator 31.

[Method of Generating Spurious-free Transmission Signal]

There is shown how to calculate a window function H that theoretically makes a filter with loss minimum under a constraint condition to make a transmission signal spurious free, below called a "spurious free condition".

Let W be a weight vector corresponding to the sampled data of a transmission pulse, $$W = [w_1 \, w_2 \ldots w_{N_1}] \tag{1}$$

where the subscript "$N_f$" denotes all sampling numbers of the transmission pulse in an aperture time.

Further, let y be a spectrum pattern vector expressing the frequency spectrum of these data, $$y = [y_1 \, y_2 \ldots y_{N_1}]. \tag{2}$$

This spectrum pattern vector y comprises outputs at respective frequencies (discrete sample points) on a frequency space.

Then, we can describe a relationship between the weight vector W and the spectrum pattern vector y as $$y^T + QW^T, \tag{3}$$

$$Q = \begin{pmatrix} q_{11} & \cdots & q_{1N_f} \\ \vdots & \ddots & \vdots \\ q_{N_f 1} & \cdots & q_{N_f N_f} \end{pmatrix} \tag{4}$$

$$q_{nk} = e^{-j\frac{2\pi}{N_f}(n-1)(k-1)} \tag{5}$$

where "Q" represents a fast Fourier transform matrix (FFT matrix) and n,k=1,2, . . . ,$N_f$. It is noted here that the subscript "$N_f$" defined above also represents the number of FFT points, and the superscript "T" represents transpose.

The inverse matrix (IFFT matrix) of the FFT matrix (4) is calculated as $$\hat{Q} = \frac{1}{N_f} Q^* \tag{6}$$

where "*" denotes complex conjugate.

It is noted that the convolution of the spectrum pattern calculated by (3) and that of an input pulse is a spectrum pattern to be observed.

Figure 3:
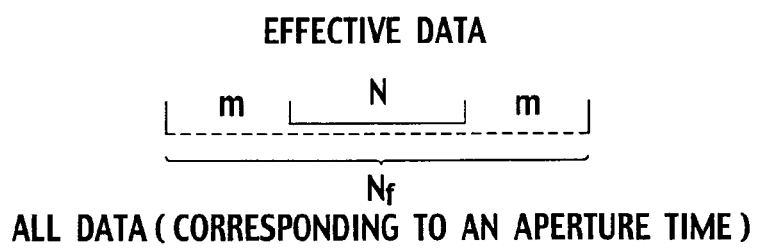
FIG. 3 shows effective data for the transmission signal generating unit according to the above embodiment.

Now, let us suppose the width of the transmission pulse satisfying a predetermined basic performance, such as range resolution ability, as effective data, and suppose that the effective data is in the central area of the weight vector W as shown in FIG. 3.

Then, a weight vector $W_m$ is expressed as $$W_m^T = uW^T \tag{7}$$

$$= \alpha^* u \{(u^T u^*)^{-1}\}^T u^{T^*} S^{T^*}$$

that makes outputs from a spurious-frequency area zero and the SNR of the center frequency maximum. Here "S" is a steering vector showing the center frequency.

Thus, a window function H except for a constant term is represented by $$H = u^* \{(u^T u^*)^{-1}\} u^T, \tag{8}$$

$$u = \hat{Q} Q_m \hat{Q} Q_s \tag{9}$$

that is the weight of an aperture excluding the steering vector S.

For reference, the calculation processes from (7) to (9) is described in detail below.

(1) Method of Generating Spurious-free Filter

When the data outside the effective data are made zero as shown in FIG. 3, a weight vector is represented by $$W_s = \begin{bmatrix} \underbrace{0 \cdots 0}_{m} & w_{m+1} \cdots w_{N_f - m} & \underbrace{0 \cdots 0}_{m} \end{bmatrix}. \tag{10}$$

Moreover, a frequency vector that allows only the outputs on frequency sample points within a range from the position "a main lobe−$N_x$" to the position "the main lobe+$N_x$" and makes outputs on the other frequency sample points zero is represented by $$y_m = [0 \ldots 0 \, y_{K-N_x} \ldots y_K \ldots y_{K+N_x} \, 0 \ldots 0]. \tag{11}$$

Here "K" is the number representing the main lobe (i.e. center frequency) of a frequency filter to be observed, and therefore the other frequency sample points are supposed as side-lobes.

Then, we can describe a relationship between the weight vector $W_s$ and the frequency vector $y_m$ as $$y_m^T = Q_m W_s^T, \quad (12)$$

$$Q_m = \begin{bmatrix} 0 & \cdots & 0 \\ \vdots & \ddots & \vdots \\ 0 & \cdots & 0 \\ q_{k-N_x,1} & \cdots & q_{k-N_x,N_f} \\ \vdots & & \vdots \\ q_{k+N_x,1} & \cdots & q_{k+N_x,N_f} \\ 0 & \cdots & 0 \\ \vdots & \ddots & \vdots \\ 0 & \cdots & 0 \end{bmatrix} \quad (13)$$

As described above, since the frequency vector $y_m$ shows a spectrum pattern where all side-lobes without the main lobe and its neighborhood are made zero. When the weight vector $W=W_m$ that satisfies $$y_m^T = QW^T \quad (14)$$

is the weighted vector to be intended. Here (14) is obtained by substituting $y_m$ into (3). When (12) is set as a constraint condition for (14), there is obtained $$y_m^T = QW_m^T = Q_m W_s^T. \quad (15)$$

Accordingly, the weight vector $W_m$ to be obtained is represented by $$W_m^T = \hat{Q} Q_m W_s^T. \quad (16)$$

(2) Method of Maximizing Filter Output

"SNR" is defined as the ratio (unit: dB) of noise to an output signal, and the SNR of the present case is represented by $$SNR = \frac{(SW_m^T)(SW_m^T)^{T*}}{W_m W_m^{T*}} \quad (17)$$

where "S" is a vector that shows the series of sample values of the input signal corresponding to the center frequency of the frequency filter, and is written as $$S = \begin{bmatrix} 1 & e^{-j\varphi} & e^{-j2\varphi} & \cdots & e^{-j(N_f-1)\varphi} \end{bmatrix}, \quad (18)$$

$$\varphi = -2\pi \frac{K-1}{N_f}, \quad (19)$$

Under the above described constraint condition (side-lobe free condition), the following identity is introduced to obtain the weight vector $W_m$ which makes the SNR represented by (17) maximum, $$QW_s^T = Q_s W^T \quad (20)$$

where $$Q_s = \begin{bmatrix} 0 & \cdots & 0 & q_{1,m+1} & \cdots & q_{1,N_f-1} & 0 & \cdots & 0 \\ \vdots & & \vdots & \vdots & & \vdots & \vdots & & \vdots \\ \vdots & \ddots & \vdots & \vdots & & \vdots & \vdots & \ddots & \vdots \\ \vdots & & \vdots & \vdots & & \vdots & \vdots & & \vdots \\ 0 & \cdots & 0 & q_{N_f,m+1} & \cdots & q_{N_f,N_f-1} & 0 & \cdots & 0 \end{bmatrix} \quad (21)$$

$$\underbrace{\phantom{0 \cdots 0}}_{m} \underbrace{\phantom{q_{1,m+1} \cdots q_{1,N_f-1}}}_{N} \underbrace{\phantom{0 \cdots 0}}_{m}$$

Note here that (20) is rewritten as $$W_s^T = \hat{Q} Q_s W^T. \quad (22)$$

Using (22), (16) can be rewritten as $$\begin{aligned} W_m^T &= \hat{Q} Q_m W_s^T \\ &= \hat{Q} Q_m \hat{Q} Q_s W^T \\ &= uW^T \end{aligned} \quad (23)$$

where $$u \equiv \hat{Q} Q_m \hat{Q} Q_s. \quad (24)$$

Further, the denominator (noise output) of (17) is rewritten as $$\begin{aligned} W_m W_m^{T*} &= (uW^T)^T (uW^T)^* \\ &= W u^T u^* W^{T*} \\ &= W z W^{T*} \end{aligned} \quad (25)$$

where $$z = u^T u^*. \quad (26)$$

Likewise, the numerator (signal output) of (17) is rewritten as $$\begin{aligned} (SW_m^T)(SW_m^T)^{T*} &= (SuW^T)(SuW^T)^{T*} \\ &= (vW^T)(vW^T)^{T*} \end{aligned} \quad (27)$$

where $$v \equiv S u. \quad (28)$$

Thus, using the re-defined vectors $$F \equiv v z^{\frac{1}{2}*}, \quad G \equiv W^* z^{\frac{1}{2}*} \quad (29)$$

and Schwarts's inequality for arbitrary vectors F and G $$(FG^{T*})(FG^{T*})^{T*} \leq (FF^{T*})(GG^{T*}), \quad (30)$$

(17) can be rewritten as $$SNR = \frac{(vW^T)(vW^T)^{T*}}{WzW^{T*}} \quad (31)$$

-continued $$= \frac{(F \cdot G^{T*})(F \cdot G^{T*})^T}{G \cdot G^T}$$

$$\leq \frac{(F \cdot F^T)(G \cdot G^{T*})}{G \cdot G^T}$$

$$= F \cdot F^{T*}$$

$$= vz^{-\frac{1}{2}^*} \cdot z^{-\frac{1}{2}^*} v^{T*}$$

$$= vz^{-1^*} v^{T*}.$$

When the equality is established in (31), the SNR takes a maximum value. Then, the condition for the equality is given as $$G = \alpha F \quad (32)$$

where $\alpha$ is a constant.

(3) Derivation of Side-lobe-free Filter Coefficient

Substituting (29) into (32), we get $$G = \alpha F \quad (33)$$

$$\leftrightarrow W^* z^{\frac{1}{2}^*} = \alpha v z^{-\frac{1}{2}^*}$$

$$\leftrightarrow W^* = \alpha v z^{-1^*}$$

$$\leftrightarrow W = \alpha^* v^* z^{-1} = \alpha^* S^* u^* (u^T u^*)^{-1}.$$

Substituting (33) into (16), we can obtain the weight vector $W_m$ to be intended as $$W_m^T = uW^T \quad (34)$$

$$= \alpha^* u \{(u^T u^*)^{-1}\}^T u^{T*} S^{T*}$$

$$= \alpha^* H^T S^{T*},$$

$$\therefore W_m = \alpha^* S^* H, H = u^* (u^T u^*)^{-1} u^T. \quad (35)$$

This window function H has a filter band width corresponding to the number of effective data set initially and makes the SNR maximum under the side-lobe free condition. It is clear that above calculations do not use any convergence method.

By using the window function H obtained above it is possible to generate a transmission signal where the SNR of the center frequency of the input signal is made maximum and the spurious components of the input signal are reduced. That is, according to the transmission signal generating unit 10, since the signal loss of the center frequency is made minimum, the signal level can be ensured and the frequency band can be narrowed.

In the above example, the waveform of the input signal formed with the data number $N_f$ including a predetermined center frequency is defined as an original waveform and further the original waveform is defined as the steering vector S. Then the window function H is applied to generate the weighted vector W corresponding to the transmission signal. It is however possible to store the window function H that is pre-calculated in the above steps in a memory unit (not shown).

It is also possible to use a signal with a predetermined frequency as the original waveform and also to use a frequency-modulated waveform, such as a chirp signal, as the original waveform. In addition, it is also possible to transmit continuously or intermittently a plurality of phase-modulated pulses with a waveform whose amplitude is modulated using the above window function.

The transmission signal generating unit 10 according to the present embodiment comprises: the window function calculator 31 that calculates a window function that makes all frequencies without a center frequency of an input signal and its adjacent frequencies zero and makes the SNR of the center frequency maximum; and the transmission signal generator 32 that generates a transmission signal whose amplitude is modulated in a shape of an envelope curve.

This enables to generate the transmission signal where the spurious components are reduced and the signal level of the center frequency is made maximum.

When the direct generation of the transmission signal is difficult, it is also possible to make a required center frequency by frequency-converting the transmission signal from the transmission signal generating unit 10 to a signal with a higher frequency.

Figure 4:
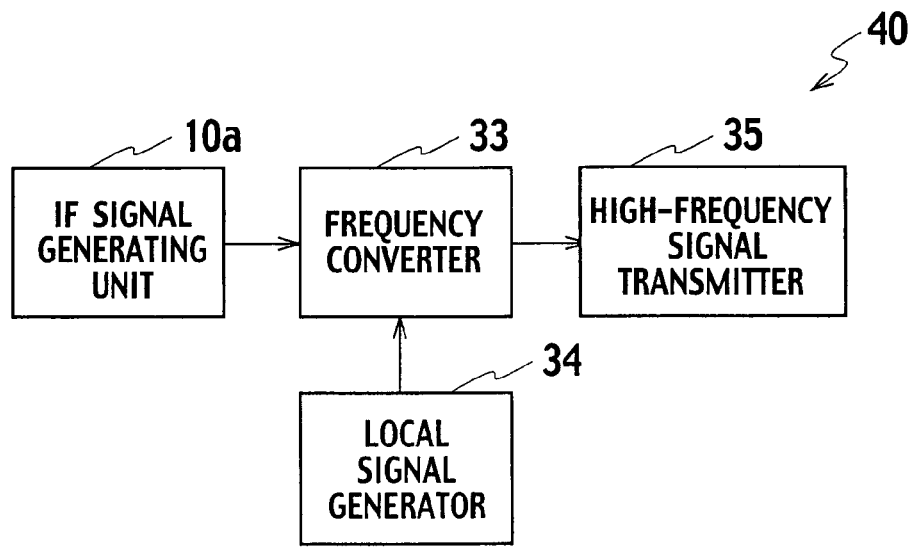
FIG. 4 shows the structure of a radar transmission device having the transmission signal generating unit according to the above embodiment.

FIG. 4 shows the structure of a radar transmission device which is applied with the transmission signal generating unit according to the present embodiment.

A radar transmission device 40 comprises an intermediate frequency signal (IF signal) generating unit 10a as the transmission signal generating unit 10 in FIG. 1, a local signal generator 34 (same as the local oscillator 12) that generates a local signal, a frequency converter 33, and a high-frequency signal transmitter 35. The frequency converter 33 frequency-converts (up-convert) an output signal from the IF signal generating unit 10a, using the local signal, to a frequency signal having a higher frequency than that of the output signal. The high-frequency signal transmitter 35 transmits the frequency signal frequency-converted by the frequency converter 33.

The radar transmission device 40 is applied with the transmission signal generating unit 10a according to the present embodiment. Thus, it generates a transmission signal by modulating the amplitude of an input signal based on a window function that makes, for the input signal, all of the outer frequencies excluding a center frequency and its adjacent frequencies zero and at the same time makes the SNR of the center frequency maximum. It is therefore possible to suppress spurious components and to make the signal level of the center frequency maximum. Such radar transmission device is applicable to transmission units of radar systems, and so on.

This application is based upon the Japanese Patent Applications No. 2006-145733, filed on May 25, 2006, the entire content of which is incorporated by reference herein.

What is claimed is:

1. A transmission signal generating unit comprising:
   a window function calculator that generates a window function that makes all frequencies without a center frequency of an input signal and its adjacent frequencies zero and makes a signal to noise ratio of the center frequency maximum; and
   a transmission signal generator that generates a transmission signal whose amplitude is modulated based on the window function generated by the window function calculator,
   wherein the window function calculator multiplies a transformation matrix one or more times in a calculation of the window function, the transformation matrix in which all row or column elements that form spurious frequency components required to be zero in a frequency space are set to zero.

2. The transmission signal generating unit of claim 1, wherein the input signal is a non-modulated pulse signal with a same frequency as the center frequency.

3. The transmission signal generating unit of claim 2, wherein the transmission signal generator generates an amplitude-modulated pulse string as the transmission signal, each pulse having a modulated phase.

4. The transmission signal generating unit of claim 1, wherein the input signal is a frequency-modulated pulse signal including the center frequency.

5. The transmission signal generating unit of claim 4, wherein frequency modulation is achieved using a chirp signal.

6. The transmission signal generating unit of claim 1, wherein the transformation matrix is a FFT matrix.

7. A radar transmission device comprising:
a transmission signal generating unit including
a window function calculator that generates a window function that makes all frequencies without a center frequency of an input signal and its adjacent frequencies zero and makes a signal to noise ratio of the center frequency maximum, and
a transmission signal generator that generates a transmission signal whose amplitude is modulated based on the window function generated by the window function calculator,
wherein the window function calculator multiplies a transformation matrix one or more times in a calculation of the window function, the transformation matrix in which all row or column elements that form spurious frequency components required to be zero in a frequency space are set to zero, and
a frequency conversion unit that converts a frequency of an output signal of the transmission signal generating unit into a frequency signal with a frequency higher than that of the output signal using a local signal; and
a signal transmission unit that transmits a frequency signal frequency-converted by the frequency conversion unit.

* * * * *